United States Patent
Kim

(10) Patent No.: US 7,531,884 B2
(45) Date of Patent: May 12, 2009

(54) CMOS IMAGE SENSOR WITH BACKSIDE ILLUMINATION AND METHOD FOR MANUFACTURING THE SAME

(75) Inventor: Hee-Jeen Kim, Chungcheongbuk-do (KR)

(73) Assignee: MagnaChip Semiconductor, Ltd., Chungcheongbuk-do (KR)

( * ) Notice: Subject to any disclaimer, the term of this patent is extended or adjusted under 35 U.S.C. 154(b) by 104 days.

(21) Appl. No.: 11/646,236

(22) Filed: Dec. 28, 2006

(65) Prior Publication Data

US 2007/0152250 A1    Jul. 5, 2007

(30) Foreign Application Priority Data

Dec. 29, 2005    (KR) ............... 10-2005-0134110

(51) Int. Cl.
*H01L 31/00* (2006.01)
*H01L 31/062* (2006.01)

(52) U.S. Cl. .............. 257/440; 257/292; 257/447; 257/460

(58) Field of Classification Search ......... 257/290–292, 257/431, 443, 447, 460, 228, 440, E27.131, 257/E27.135; 438/48
See application file for complete search history.

(56) References Cited

U.S. PATENT DOCUMENTS

| | | | |
|---|---|---|---|
| 7,193,289 B2 * | 3/2007 | Adkisson et al. ............. | 257/431 |
| 7,423,306 B2 * | 9/2008 | Liu et al. ..................... | 257/292 |
| 2008/0116537 A1 * | 5/2008 | Adkisson et al. ............ | 257/448 |

* cited by examiner

*Primary Examiner*—Hung Vu
(74) *Attorney, Agent, or Firm*—Morgan Lewis & Bockius LLP

(57) ABSTRACT

A CMOS image sensor includes a plurality of pixel regions formed under a front surface of a substrate, and having photodiodes separated from each other by a field oxide, a multi-layered metal interconnection formed over the pixel regions of the front of the substrate, a bump connected to an uppermost metal interconnection of the multi-layered metal interconnection, a plurality of trenches formed in a backside of the substrate, wherein the trenches have different depths for each wavelength of light, and correspond to the respective pixel regions, and a glass covering the backside of the substrate.

8 Claims, 10 Drawing Sheets

CMOS IMAGE SENSOR WITH BACKSIDE ILLUMINATION AND METHOD FOR MANUFACTURING THE SAME

CROSS-REFERENCE TO RELATED APPLICATIONS

The present invention claims priority of Korean patent application number 10-2005-0134110, filed on Dec. 29, 2005, which is incorporated by reference in its entirety.

BACKGROUND OF THE INVENTION

The present invention relates to an image sensor, and more particularly, to a complementary metal oxide semiconductor (CMOS) image sensor and a method for manufacturing the same.

In general, an image sensor is a semiconductor device that converts an optical image into an electrical signal. Among the image sensors, a charge-coupled device (CCD) has a structure in which each MOS capacitor is closely located and charges are stored in the MOS capacitor and transferred. Whereas, a CMOS image sensor employs CMOS technology that uses a control circuit and a signal processing circuit as peripheral circuits and adopts a switching mode that detects outputs sequentially. Here, MOS transistors are formed in the peripheral circuit as the same number of pixels in the CMOS image sensor.

In general, a unit pixel of a CMOS image sensor includes a photodiode PD and four NMOS transistors NX, RX, SX and DX. The four NMOS transistors NX, RX, SX and DX are configured with a transfer transistor TX for transferring photogenerated charges collected in the photodiode PD to a floating diffusion region FD, a reset transistor RX for setting the potential of the floating diffusion region FD at a desired level and emitting charges $C_{pd}$ to reset the floating diffusion region FD, a drive transistor DX serving as a source follower buffer amplifier, and a select transistor SX for addressing a switching mode.

The transfer and reset transistor TX and RX employ a native NMOS transistor, and the drive and select transistors DX and SX employ a normal NMOS transistor. The reset transistor RX is used for correlated double sampling (CDS).

In the unit pixel of the CMOS image sensor as described above, light in the visible wavelength range is sensed by the photodiode PD using a native transistor, and thereafter the amount of the sensed photogenerated charges transferred to the floating diffusion node FD, i.e., a gate of the drive transistor DX, is outputted as an electrical signal at an output terminal VOUT.

FIG. 1 illustrates a sectional view of a typical CMOS image sensor.

Referring to FIG. 1, a pixel 12 having a photodiode is formed under a surface of a silicon substrate 11. A multi-layered insulating layer 13 is formed over the silicon substrate 11. Multi-layered metal interconnections, e.g., tri-layered metal interconnections M1, M2 and M3, are formed between the respective insulating layers of the multi-layered insulating layer 13.

In the typical CMOS image sensor of FIG. 1, the pixel 12 is formed under the front surface of the silicon substrate 11, and the metal interconnections M1, M2 and M3 do not exist over the photodiode of the pixel 12. Thus, light is transmitted through the front of a wafer, and reaches the photodiode after passing through the multi-layered insulating layer 13.

When using this CMOS image sensor of FIG. 1, there is no problem to realize an image in a VGA CMOS image sensor. However, if the number of pixels is rapidly increased more than 2 M, a pixel size should be reduced. This reduction of the pixel size leads to the decrease of the quantity of light incident on the photodiode, which makes sensitivity of the CMOS image sensor to be deteriorated.

To compensate such a limitation, there has been proposed a backside illumination architecture that illuminates light through a backside of the wafer after the backside of the wafer is thinned, as illustrated in FIG. 2.

FIG. 2 illustrates a sectional view of another typical CMOS image sensor with a backside illumination.

Referring to FIG. 2, a pixel 22 is formed under a front surface of a silicon substrate 21. Some of metal interconnections M1, M2 and M3 are disposed over a photodiode of the pixel 22, and light is transmitted through a backside of the silicon substrate 21.

The backside illumination architecture of FIG. 2 can prevent a loss of the quantity of light which may occur while the light passing through the insulating layer. In addition, as the metal interconnection can be formed over the photodiode, a pixel area can be increased to improve characteristic of the image sensor.

When fabricating the CMOS image sensor with the backside illumination, the backside of the silicon substrate 21 should be thinly processed. However, in order to process the backside of the silicon substrate 21 to a thickness ranging from approximately 10 µm to approximately 20 µm, the backside may be grinded after wafer or a glass is attached to a front of the silicon substrate 21. Moreover, after grinding the backside, the backside of the wafer should be thinned through chemical-etching process. Accordingly, an overall process is too complicated.

Furthermore, to connect a lead for package fabrication, there is required a process of forming a super contact 23 (hereinafter, referred to as super contact process) that connects the metal interconnection to the backside of the silicon substrate 21. Thus, to manufacture the CMOS image sensor with the backside illumination, multi-step processes are required, and thus the fabrication process becomes too complicated. Although the grinding and chemical-etching processes are performed, it is somewhat difficult to obtain the wafer of which the backside has a desired thickness. Thus, there is a limitation to realize a desired image according to the typical CMOS image sensor.

SUMMARY OF THE INVENTION

Embodiments of the present invention provide a complementary metal oxide semiconductor (CMOS) image sensor that can easily realize a color image by removing color filters and adjusting a backside thickness of a wafer, and a method for manufacturing the same.

In accordance with an aspect of the present invention, there is provided a CMOS image sensor, including: a plurality of pixel regions formed under a front surface of a substrate, and having photodiodes separated from each other by a field oxide; a multi-layered metal interconnection formed over the pixel regions of the front of the substrate; a bump connected to an uppermost metal interconnection of the multi-layered metal interconnection; a plurality of trenches formed in a backside of the substrate, wherein the trenches have different depths for each wavelength of light, and correspond to the respective pixel regions; and a glass covering the backside of the substrate.

In accordance with another aspect of the present invention, there is provided a method for manufacturing a CMOS image sensor, the method including: forming a plurality of pixel regions configured with blue, green and red pixels having respective photodiodes under a front surface of a substrate; forming a multi-layered metal interconnection over the pixel regions; forming a bump connected to an uppermost metal interconnection of the multi-layered metal interconnection; back-grinding a backside of the substrate to a predetermined thickness; forming a plurality of trenches formed in the back-grinded backside of the substrate, wherein the trenches have different depths for each wavelength of light, and correspond to the respective pixel regions; and forming a glass covering the backside of the substrate.

DESCRIPTION OF SPECIFIC EMBODIMENTS

Figure 1:
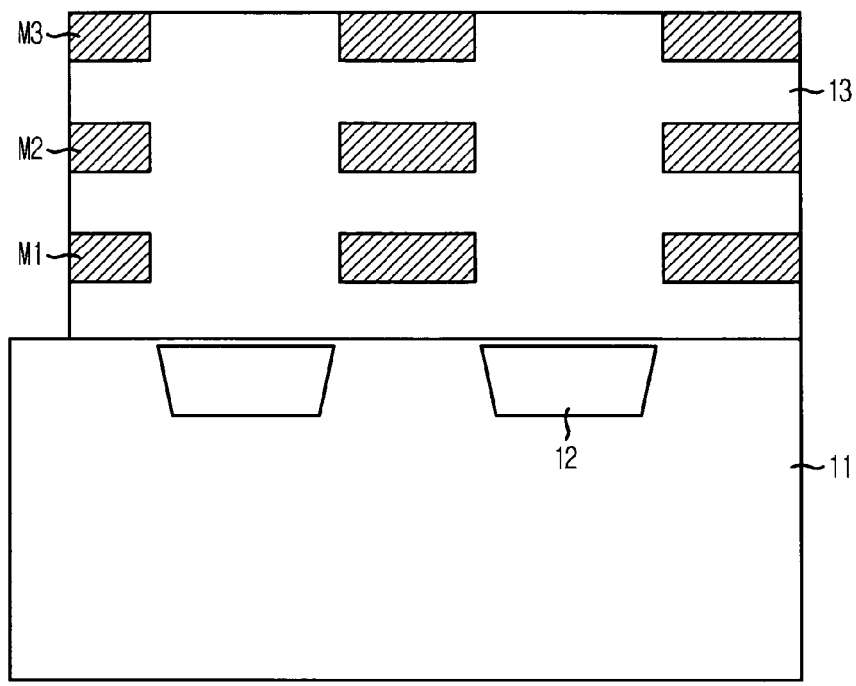
FIG. 1 illustrates a sectional view of a typical complementary metal oxide semiconductor (CMOS) image sensor.
Figure 2:
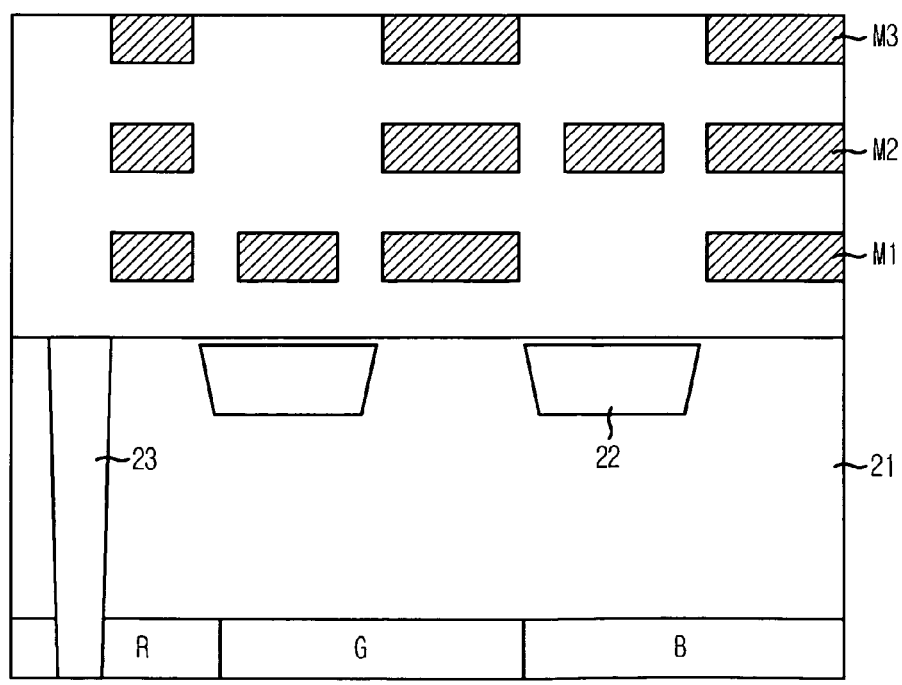
FIG. 2 illustrates a sectional view of another typical CMOS image sensor with a backside illumination.
Figure 3:
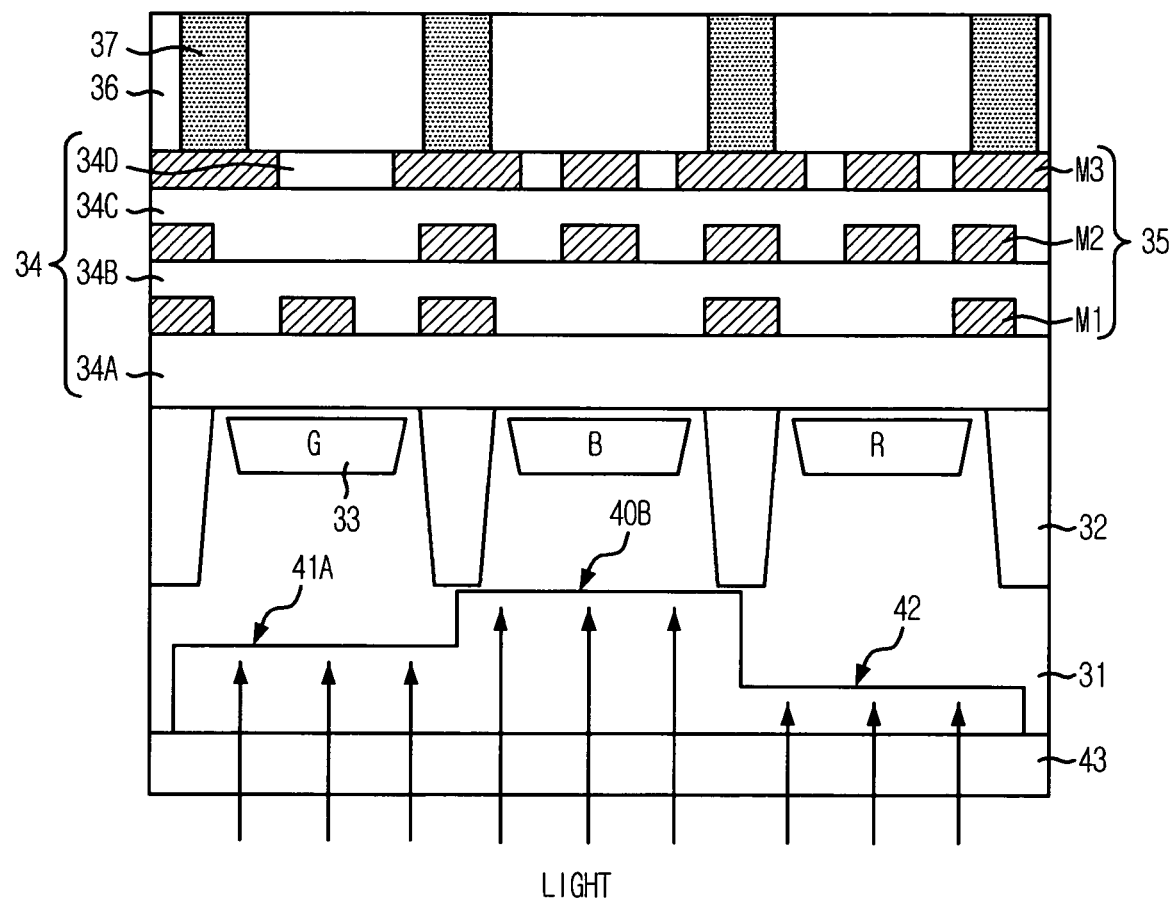
FIG. 3 illustrates a sectional view of a CMOS image sensor in accordance with an embodiment of the present invention.

FIG. 3 illustrates a sectional view of a CMOS image sensor in accordance with an embodiment of the present invention.

Referring to FIG. 3, the CMOS image sensor in accordance with the embodiment of the present invention includes a plurality of pixel regions 33, a multi-layered metal interconnection 35, a bump 37, a first trench 40B, a second trench 41A, a third trench 42, and a glass 43. Herein, the plurality of pixel regions 33 are formed under a front surface of a substrate 31 (e.g., silicon substrate) for realizing color image, and have photodiodes separated from each other by a field oxide 32. The multi-layered metal interconnection 35 is formed over the pixel regions 33 of the front of the substrate 31. The bump 37 is connected to an uppermost metal interconnection M3 of the multi-layered metal interconnection 35. The first, second and third trenches 40B, 41A and 42 having different depths for each wavelength of light are formed in a backside of the substrate 31, and they correspond to the respective pixel regions 33. The backside of the substrate 31 is covered with the glass 43.

Specifically, the pixel regions 33 includes a blue pixel region B that blue light having the shortest wavelength is incident on, a red pixel R that red light having the longest wavelength is incident, and a green pixel region that green light having intermediate wavelength is incident on.

The first, second and third trenches 40B, 41A and 42 are correspondent to the blue, green and red pixels B, G and R, respectively. Herein, the third trench 42 corresponding to the red pixel R has the smallest depth, and the first trench 40B corresponding to the blue pixel B has the greatest depth. The second trench 41A corresponding to the green pixel G has an intermediate depth between the depths of the first and third trenches 40B and 42. The first trench 40B corresponding to the blue pixel B has the depth close to the photodiode of the blue pixel B, and a separation distance between the photodiode of the blue pixel B and a bottom surface of the first trench 40B is approximately 10 μm. That is, the substrate 31 has the thickness of approximately 10 μm between the photodiode of the blue pixel B and the bottom surface of the first trench 40B is approximately 10 μm.

The backside of the substrate 31 with the first to third trenches 40B, 41A and 42 formed has undergone a back-grinding process. Thus, the thickness of the substrate 31 from the front to the backside is in the range of approximately 70 μm to approximately 200 μm, e.g., preferably, in the range of approximately 70 μm to approximately 100 μm.

The multi-layered metal interconnection 35 is configured with a plurality of metal interconnections M1, M2 and M3 formed between respective interlayer dielectric (ILD) layers 34A, 34B, 34C and 34D constituting a multi-layered ILD layer 34. Some of the metal interconnections existing in one layer may be formed over the photodiode of each pixel region R, G and B, which makes it possible to increase an area of the pixel region R, G and B. The bump 37 penetrates a passivation layer 36 so that it is connected to a portion of the uppermost metal interconnection M3.

As described above, since light passing through the glass 43 can be transmitted through the backside of the substrate 31, in other words, since the light is not interfered with the metal interconnection, it is possible to obtain a backside illumination to increase light sensitivity. In addition, without processing the backside of the substrate 31 to a thickness ranging from approximately 10 μm to approximately 20 μm, it is possible to control the substrate 31 of the respective pixel regions to have small thickness by means of the trenches. Further, it is unnecessary to perform a super contact process because the bump 37 that will be connected to the lead for package fabrication is formed over the front of the substrate 31.

Thereinafter, a method for manufacturing the CMOS image sensor of FIG. 3 will be illustrated with reference to the accompanying drawings.

FIGS. 4A to 4H illustrate sectional views of a method for manufacturing a CMOS image sensor in accordance with an embodiment of the present invention.

Figure 4A:
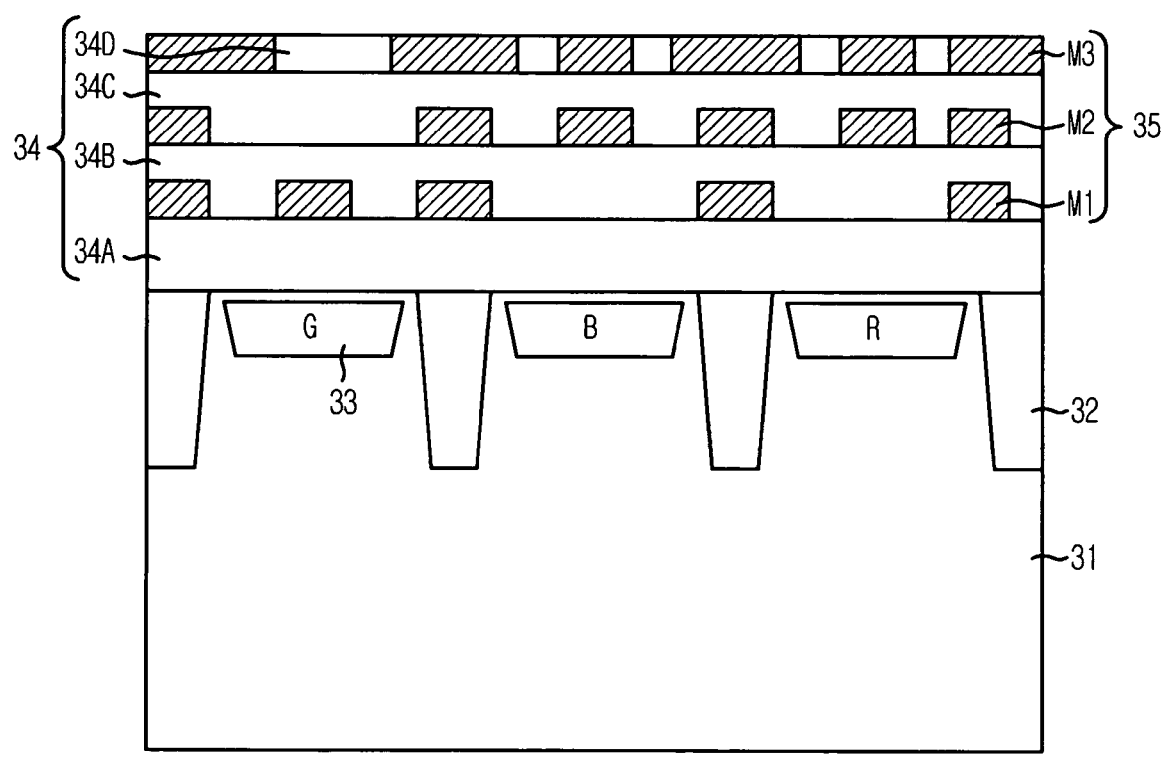
FIGS. 4A to 4H illustrate sectional views of a method for manufacturing a CMOS image sensor in accordance with an embodiment of the present invention.

Referring to FIG. 4A, after forming a field oxide 32 in a front of a substrate 31 through device isolation process, a typical process of forming transistors of CMOS image sensor is performed on the front of the substrate 31. That is, a photodiode PD and a plurality of transistors NX, RX, SX and DX are formed. Herein, the four transistors NX, RX, SX and DX are configured with a transfer transistor TX for transferring photogenerated charges collected in the photodiode PD to a floating diffusion region FD, a reset transistor RX for setting the potential of the floating diffusion region FD at a desired level and emitting charges $C_{pd}$ to reset the floating diffusion region FD, a drive transistor DX serving as a source follower buffer amplifier, and a select transistor SX for addressing a switching mode.

Hereinafter, the above constitution elements including the photodiode PD are referred to as a pixel 33. The pixel 33 is configured with a green pixel G, a blue pixel B and a red pixel R, and the photodiodes of the respective pixels 33 have the same area and depth. Therefore, the field oxide 32 plays a role in separating the respective pixels 33 from each other.

After forming the pixel 33, an ILD deposition process and a metal interconnection process are alternately performed on the substrate 31 to form a multi-layered metal interconnection 35 in which metal interconnections M1, M2 and M3 are disposed between a plurality of ILD layers 34A, 34B, 34C and 34D constituting a multi-layered ILD layer 34.

For realizing the backside illumination architecture of the present invention, it is preferable that the metal interconnection of the multi-layered metal interconnection 35 is disposed over the photodiode, to thereby increase an area of the pixel 33. The uppermost ILD layer 34D of the multi-layered ILD layer 34 is planarized such that a top surface of an uppermost metal interconnection M3 is exposed.

Figure 4B:
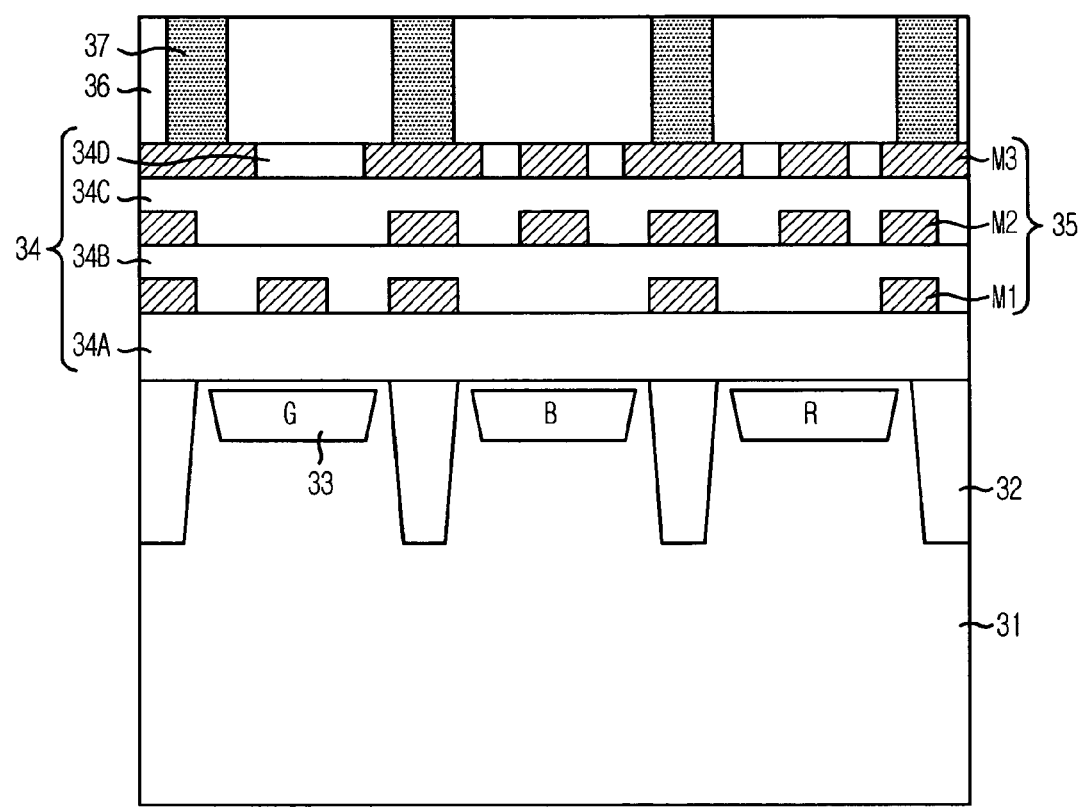
Figure 4C:
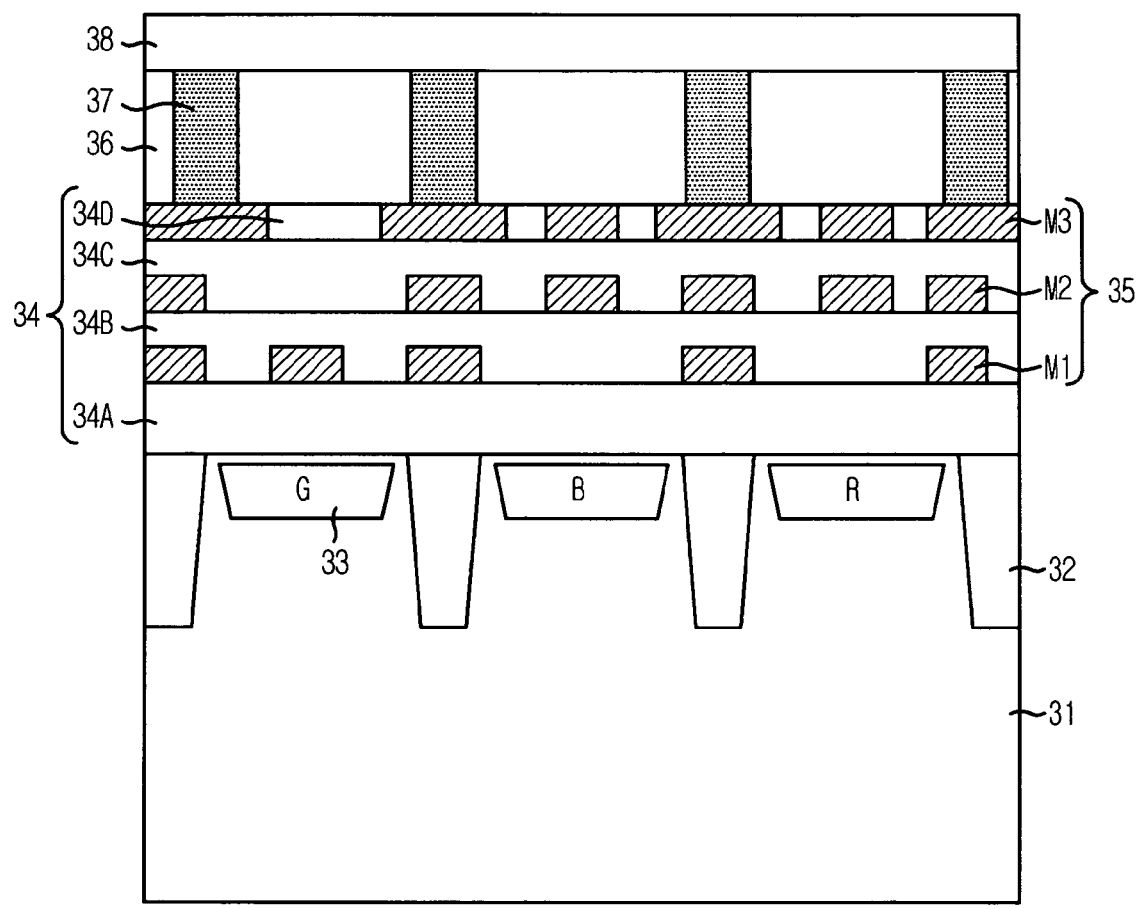

Referring to FIG. 4B, a bump process for contact with a package is performed on the substrate 31 with the multi-layered metal interconnection 35 formed. For instance, a passivation layer 36 is deposited on the uppermost metal interconnection M3 and the uppermost ILD layer 34D, and the passivation layer 36 is then selectively etched to form a contact hole exposing a surface of a portion of the uppermost metal interconnection M3. A conductive material fills the contact hole to form a bump 37 which is in contact with the surface of the portion of the uppermost metal interconnection M3. Here, the bump 37 is formed of tungsten, aluminum, or the like.

After forming the bump 37, a grinding process is performed on a backside of the substrate 31. To begin with, referring to FIG. 4C, a tape 38 is attached to the front of the substrate 31 in order to prevent the front of the substrate 31 from being damaged during the grinding process.

Figure 4D:
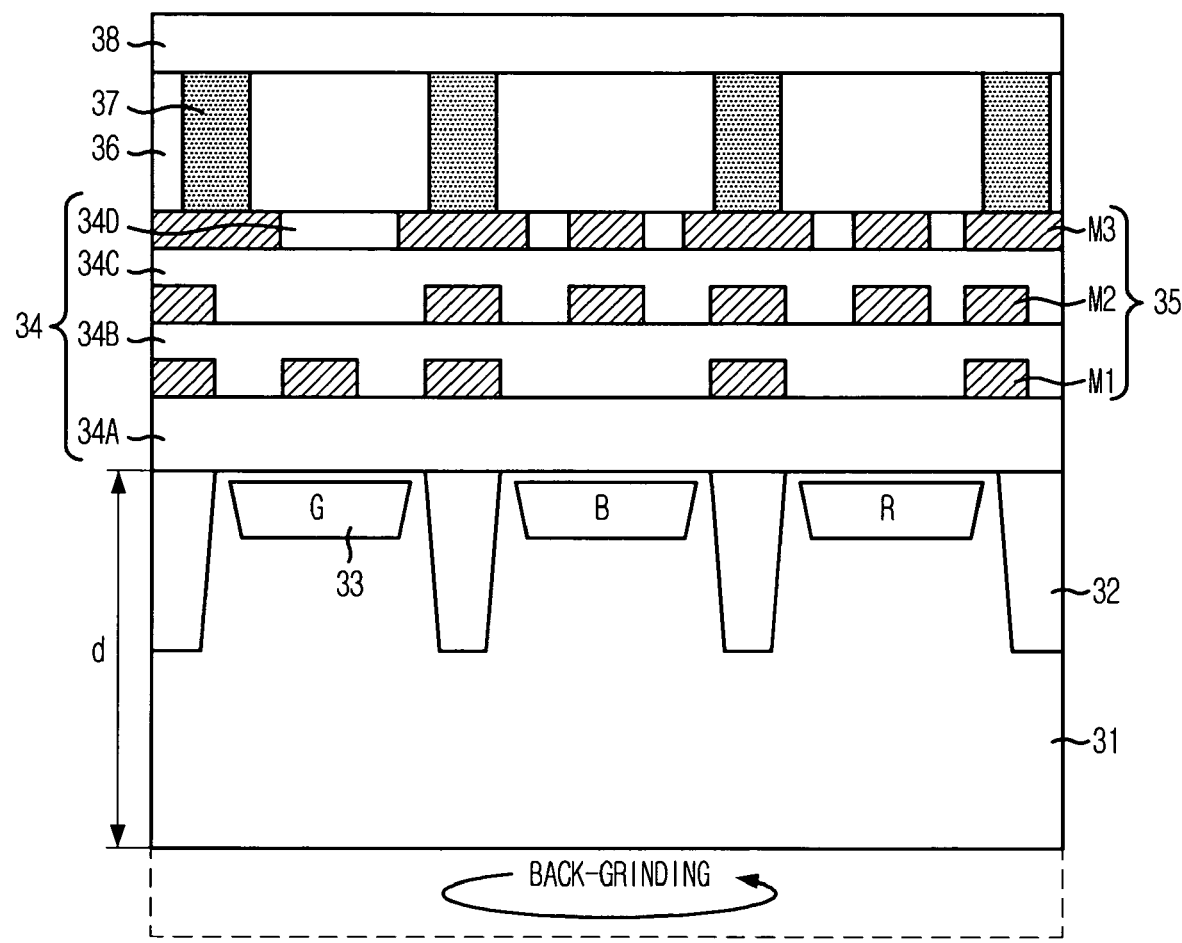

Referring to FIG. 4D, the grinding (hereinafter, referred to as a back grinding) process is performed on the backside of the substrate 31 so that the backside of the substrate 31 is left remaining with a thickness ranging from approximately 70 µm to approximately 200 µm. Preferably, after the back grinding, the backside of the substrate 31 has a thickness in the range of approximately 70 µm to approximately 100 µm.

Figure 4E:
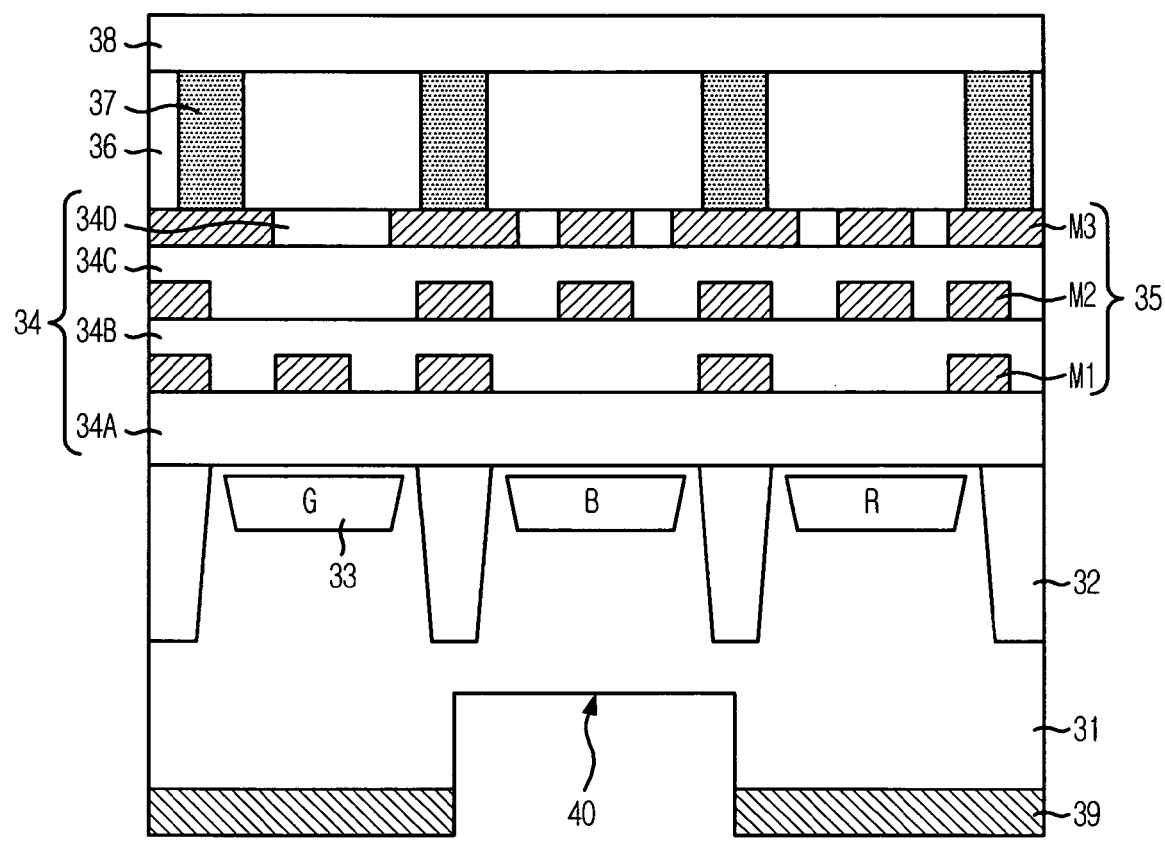

After completing the back grinding process, referring to FIG. 4E, a silicon nitride (SiN) layer 39 is formed on the backside of the substrate 31 that has undergone the back grinding process. Thereafter, the silicon nitride layer 39 is selectively etched to expose only the pixel region corresponding to the blue pixel B. That is, the silicon nitride layer 39 is etched so as to expose the blue pixel B but cover the green and red pixels G and R. The substrate 31 of the exposed blue pixel B is etched by a predetermined depth using the etched silicon nitride layer 39 as a hard mask, thereby forming a first trench 40.

Figure 4F:
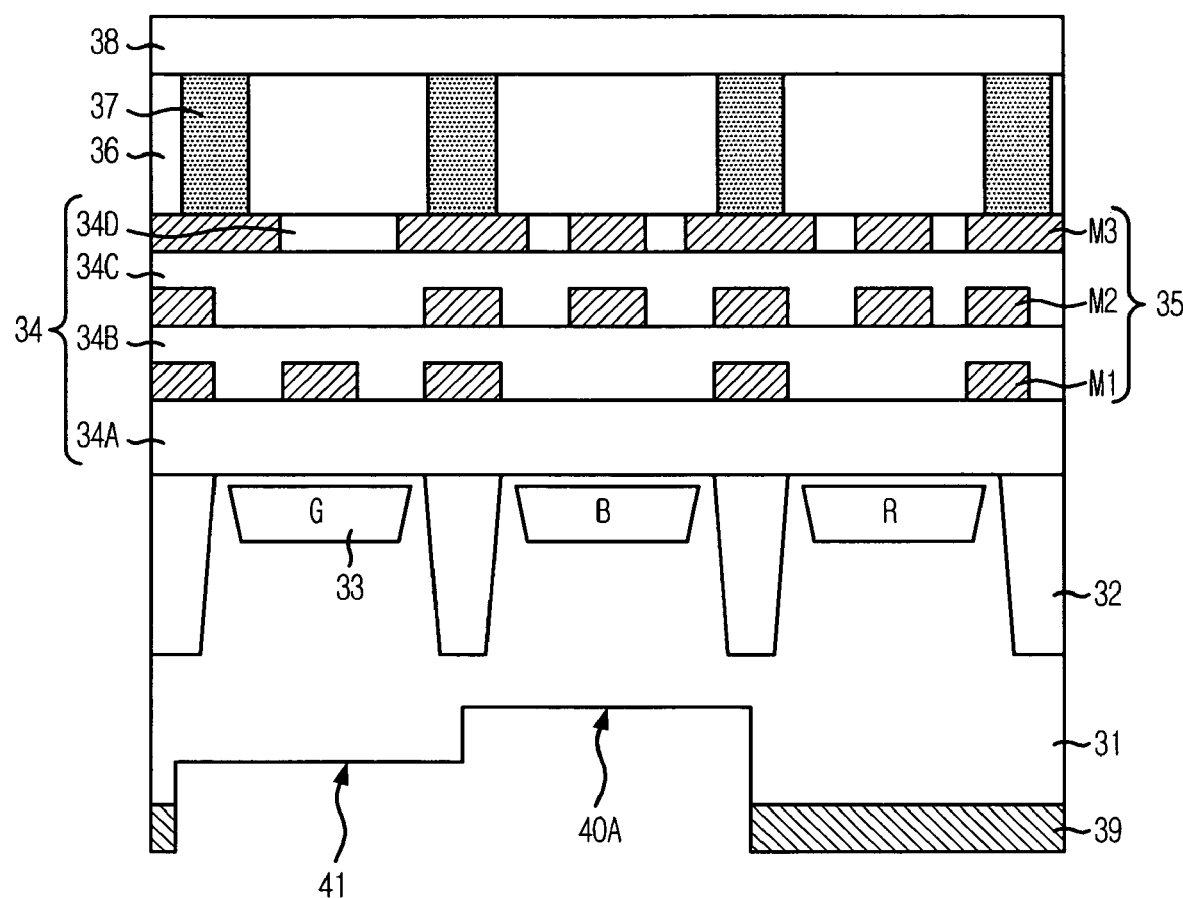

Referring to FIG. 4F, the remaining silicon nitride layer 39 is selectively etched again to expose the substrate 31 corresponding to the green pixel G as well as the blue pixel region B. The substrate 31 of the exposed green pixel G and the substrate 31 of the blue pixel B are simultaneously etched to form a pre-second trench 41 corresponding to the green pixel G and a first trench 40B with the increased depth. That is, the depth of a pre-first trench 40A corresponding to the blue pixel B is more deepened than the previous depth before the etching of the pre-second trench 41.

Figure 4G:
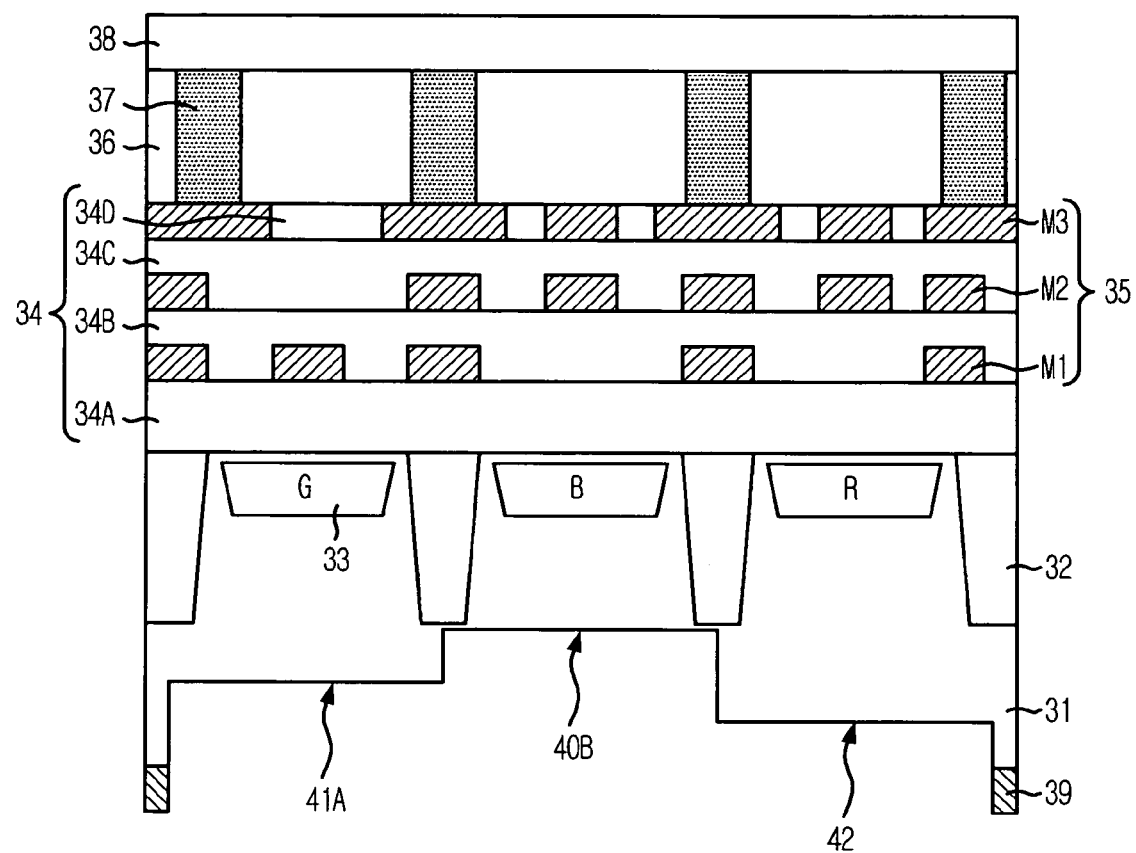

Referring to FIG. 4G, the silicon nitride layer 39 of the pixel corresponding to the red pixel R is selectively etched again to expose the substrate 31 corresponding to the red pixel R as well as the blue and green pixel B and G. Thereafter, portions of the substrate 31 corresponding to the blue pixel B, the green pixel G and the red pixel R are simultaneously etched to form a third trench 42 corresponding to the red pixel R, a second trench 41A with increased depth, and a first trench 40B with more increased depth. Here, the first trench 40B corresponding to the blue pixel B and the second trench 41A corresponding to the green pixel G have greater depths than before.

As described above, the reason that the first to third trenches corresponding to the blue, green and blue pixels have different depths from each other is that a penetration depth of light is different according to the wavelength of light. That is, even when the same quantity of light is incident on each pixel, the penetration depth of red light is the greatest but that of blue light is the smallest. Therefore, to realize uniform color, the third trench 42 corresponding to the red pixel R should have the smallest depth, and the first trench 40B corresponding to the blue pixel B should have the greatest depth. In addition, the second trench 41A has the intermediate depth between the depths of the first and third trenches 40B and 42.

In other words, the substrate 31 corresponding to the blue pixel B receiving blue light is left remaining with the smallest thickness, the substrate 31 corresponding to the green pixel G receiving green light is left remaining with an intermediate thickness, and the substrate 31 corresponding to the red pixel R receiving red light is left remaining with the greatest thickness. Resultantly, the longer the wavelength of the light, the thicker the substrate 31 is.

As for the thickness of the remaining substrate 31 or the depth of the trench, the first trench 40B corresponding to the blue pixel B has the depth close to the photodiode of the blue pixel B. For instance, a bottom of the first trench 40B and the photodiode of the blue pixel B are close to each other such that they are separated from each other by a distance of approximately 10 µm. That is, the substrate 31 with approximately 10 µm thick is left remaining between the bottom of the first trench 40B and the photodiode of the blue pixel B. Preferably, assuming that a total thickness of the substrate 31 is in the range of approximately 70 µm to approximately 200 µm, the depth of the first trench is in the range of approximately 60 µm to approximately 180 µm, the depth of the second trench 41A corresponding to the green pixel G is in the range of approximately 30 µm to approximately 90 µm, and the depth of the third trench 42 corresponding to the red pixel R is in the range of approximately 15 µm to approximately 45 µm.

Consequently, it is possible to secure the uniformity of the quantity of light incident on the photodiode of each pixel by adjusting the depth of the trench corresponding to each pixel according to the wavelength of light.

Meanwhile, the etching process of forming the first to third trenches 40B, 41A and 42 is performed through dry etch using silicon-etching gas such as HBr and $Cl_2$ as an etching gas.

Figure 4H:
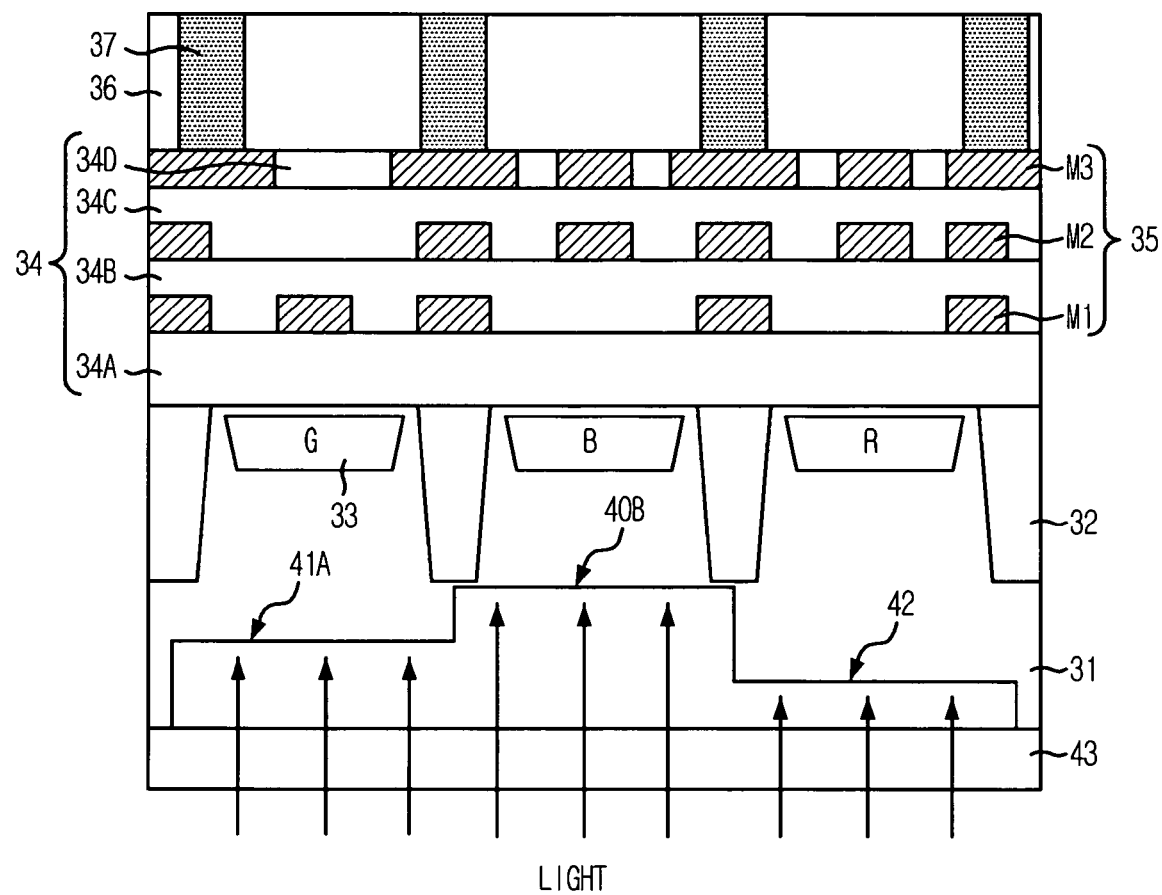

Referring to FIG. 4H, after the remaining silicon nitride layer 39 is removed using phosphoric acid, the backside of the substrate 31 with the first to third trenches 40B, 41A and 42 formed is covered with a plate-shaped glass 43. Here, the reason the substrate 31 is covered with the glass 43 is to prevent the first to third trenches 40B, 41A and 42 formed in the backside of the substrate 31 from not being damaged during a subsequent process of removing the tape 38 and to seal off the backside of the substrate 31 as well.

As above, when covering the backside of the silicon substrate 31 using the glass 43, inner spaces of the first to third trenches 40B, 41A and 42 between the glass 43 and the substrate 31 become air gaps. Thus, the light can be transmitted through the backside of the substrate 31 by the glass 43, and thus it is possible to embody the CMOS image sensor with the backside illumination. Finally, the tape 38 attached to the front of the wafer is removed.

In accordance with the above-described embodiments, for manufacturing the CMOS image sensor with the backside illumination, since the backside of the silicon substrate is partially removed through the back grinding process, and thereafter the trenches corresponding to the respective pixel regions are formed to have different depths, the present invention provides a simplified manufacture process. For example, it is unnecessary to perform a chemical etching process additionally after the back grinding. That is, without processing the backside of the silicon substrate to a thickness ranging from approximately 10 µm to approximately 20 µm, it is possible to control the silicon substrate of the respective pixel regions to have small thickness by means of the trenches.

In addition, it is not required to perform a super contact process because it is unnecessary to connect the lead for package fabrication to the backside of the silicon substrate.

As described above, the present invention provides several advantageous merits below.

First, as the inventive CMOS image sensor employs the backside illumination, it is possible to improve light sensitivity. Second, since the color filter process is not used, it is possible to reduce fabrication cost and prevent the reduction of the quantity of light occurring in the color filter. Third, it is possible to simplify the process of thinning the backside of the wafer using the back grinding process.

While the present invention has been described with respect to the specific embodiments, it will be apparent to those skilled in the art that various changes and modifications may be made without departing from the spirit and scope of the invention as defined in the following claims.

What is claimed is:

1. A complementary metal oxide semiconductor (CMOS) image sensor, comprising:
    a plurality of pixel regions formed under an upper surface of a substrate, and having photodiodes separated from each other by a field oxide;
    a multi-layered metal interconnection formed over the pixel regions of the upper surface, of the substrate;
    a bump connected to an uppermost metal interconnection of the multi-layered metal interconnection;
    a plurality of trenches formed in a backside of the substrate, wherein the trenches have different depths for each wavelength of light, and correspond to the respective pixel regions; and
    a glass covering the backside of the substrate.

2. The CMOS image sensor of claim 1, wherein the trench corresponding to the pixel region having the longest wavelength has the smallest depth, and the trench corresponding to the pixel region having the shortest wavelength has the greatest depth.

3. The CMOS image sensor of claim 2, wherein the pixel regions include a blue pixel receiving blue light with the shortest wavelength, a red pixel receiving red light with the longest wavelength, and a green pixel receiving green light with an intermediate wavelength.

4. The CMOS image sensor of claim 3, wherein the trench corresponding to the red pixel has the smallest depth, the trench corresponding to the blue pixel has the greatest depth, and the trench corresponding to the green pixel has an intermediate depth between the depths of the trenches corresponding to the red and blue pixels.

5. The CMOS image sensor of claim 4, wherein the trench corresponding to the blue pixel has a depth close to the photodiode of the blue pixel.

6. The CMOS image sensor of claim 5, wherein a separation distance between the photodiode of the blue pixel and a bottom surface of the trench corresponding to the blue pixel is approximately 10 µm.

7. The CMOS image sensor of claim 1, wherein a thickness of the substrate is in the range of approximately 70 µm to approximately 200 µm.

8. The CMOS image sensor of claim 1, wherein a portion of metal interconnections configured as the multi-layered metal interconnection is formed over the photodiode of the pixel region.

* * * * *